United States Patent
Bolz et al.

(10) Patent No.: US 6,497,222 B2
(45) Date of Patent: Dec. 24, 2002

(54) ACTUATOR CONFIGURATION AND METHOD, IN PARTICULAR, FOR ACTUATING AN INJECTION VALVE OF AN INTERNAL COMBUSTION ENGINE

(75) Inventors: Stephan Bolz, Pfatter (DE); Dieter Sass, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/068,177

(22) Filed: Feb. 5, 2002

(65) Prior Publication Data

US 2002/0162539 A1 Nov. 7, 2002

Related U.S. Application Data

(63) Continuation of application No. PCT/DE00/02663, filed on Aug. 4, 2000.

(30) Foreign Application Priority Data

Aug. 5, 1999 (DE) .......................................... 199 36 858

(51) Int. Cl.[7] ............................................... F02D 41/22
(52) U.S. Cl. ....................... 123/479; 73/117.3; 73/118.1
(58) Field of Search ................................ 123/479, 690; 73/117.3, 118.1

(56) References Cited

U.S. PATENT DOCUMENTS

| | | | |
|---|---|---|---|
| 4,394,742 A | * | 7/1983 | Crummer et al. ............ 701/102 |
| 4,839,812 A | | 6/1989 | Nusser et al. |
| 4,884,033 A | | 11/1989 | McConchie, Sr. |
| 5,406,921 A | * | 4/1995 | Noble et al. ............ 123/406.27 |
| 5,418,461 A | * | 5/1995 | Maeda et al. ................ 123/479 |
| 6,115,653 A | * | 9/2000 | Bergstrom et al. ........... 123/479 |

FOREIGN PATENT DOCUMENTS

| DE | 36 16 975 A1 | 11/1987 |
|---|---|---|
| DE | 197 23 456 A1 | 12/1998 |
| DE | 197 56 342 A1 | 7/1999 |

* cited by examiner

*Primary Examiner*—Erick R. Solis
(74) *Attorney, Agent, or Firm*—Laurence A. Greenberg; Werner H. Stemer; Ralph E. Locher

(57) ABSTRACT

Actuator configuration, in particular, for actuating an injection valve of an internal combustion engine, includes an electrically activated actuator, a power switch for activating the actuator, a control input for receiving a control signal for actuating the power switch from an external control unit through a control line, and a diagnostic circuit connected at an input end to the actuator and/or to the power switch. For sensing the operating state, the control input is connected to at least a switching element in order to influence the electrical input characteristics, and the diagnostic circuit is connected at the output end to the switching element in order to influence the input characteristics as a function of the operating state and, as a result, to permit remote diagnostics by the external control unit through the control line. A method for actuating an injection valve of an internal combustion engine is also provided.

12 Claims, 1 Drawing Sheet

ACTUATOR CONFIGURATION AND METHOD, IN PARTICULAR, FOR ACTUATING AN INJECTION VALVE OF AN INTERNAL COMBUSTION ENGINE

CROSS-REFERENCE TO RELATED APPLICATION

This application is a continuation of copending International Application No. PCT/DE00/02663, filed Aug. 4, 2000, which designated the United States.

BACKGROUND OF THE INVENTION

Field of the Invention

The invention relates to an actuator configuration, in particular, for actuating an injection valve of an internal combustion engine.

Prior art internal combustion engines include injection systems in which the injection valves are activated by actuators electrically actuated by an output stage with a power transistor, the output stage being embodied separately from the actuator and being connected thereto through a cable.

Prior art actuators also have an output stage integrated into the actuator with the cable connection between the actuator and output stage dispensed with so that the actuator can be connected directly to the engine controller through a control line. In the engine controller, all that is then necessary, instead of the output stage, is a line driver, which is capable of detecting faults on the control line between the engine controller and the actuator. In the event of a disconnection of or a short circuit in the control line, the engine controller can, therefore, immediately initiate suitable measures. However, faults diagnostics of the output stage integrated into the actuator are not possible by the line driver in the engine controller.

Therefore, prior art intelligent actuators have diagnostic capabilities in order to monitor the operating state of the actuator and the output stage. Thus, for example, short-circuits to ground or battery voltage, line breaks in the actuator, failure of the output stage, or a loss of the supply voltage can be detected during the operation of such an intelligent actuator configuration. For detection purposes, a diagnostic circuit is integrated into the actuator and it measures the output current and voltage and compares the measured values with predefined reference values. When a fault is detected, the diagnostic circuit then transmits an appropriate signal to the engine controller on a separate line.

A disadvantage with such intelligent actuators is the fact that a separate line is necessary to signal the operating state back to the engine controller.

SUMMARY OF THE INVENTION

It is accordingly an object of the invention to provide an actuator configuration, in particular, for actuating an injection valve of an internal combustion engine that overcomes the hereinafore-mentioned disadvantages of the heretofore-known devices and methods of this general type and that has an intelligent actuator configuration with an integrated output stage and diagnostic capabilities with no need for a separate line for signaling the operating state back to the engine controller.

With the foregoing and other objects in view, there is provided, in accordance with the invention, an actuator configuration, including an electrically activated actuator, a power switch connected to the actuator for activating the actuator, at least one switch, a control input for receiving a control signal from an external control unit through a control line, the control signal actuating the power switch, the control input connected to the power switch and the at least one switch for influencing electrical input characteristics of the actuator configuration, and a diagnostic circuit for sensing at least one operating state of the actuator configuration, the diagnostic circuit having a circuit input connected to at least to one of the group consisting of the actuator and the power switch and a circuit output connected to the at least one switch for influencing the input characteristics as a function of the at least one operating state and, as a result, permitting remote diagnostics by the external control unit through the control line. In particular, the actuator configuration actuates an injection valve of an internal combustion engine The invention includes the general technical teaching of transmitting the operating stage of the intelligent actuator configuration to the engine controller through the control line that is present in any case so that a separate line for signaling back the operating state can be dispensed with.

The signaling back of the operating state by the intelligent actuator configuration to the engine controller is preferably carried out by influencing the input characteristics of the actuator configuration as a function of the current operating state. The term "input characteristics" is to be understood here, and below, in a general sense and includes all status variables at the control input of the intelligent actuator configuration that can be registered by the engine controller through the control line and, thus, permit signaling back by the intelligent actuator configuration to the engine controller.

In one variant of the invention, the status-dependent change in the input characteristics takes place by virtue of the fact that the input impedance of the control input 4 is changed. For such a purpose, the control line in the intelligent actuator configuration can be connected to ground, for example, through resistors and switching elements. The engine controller can then measure the line resistance on the control line and determine the operating state of the actuator configuration therefrom. Instead of resistors, the control line can also be connected to ground or to battery voltage through other components, for example, capacitors or inductors. The input impedance of the actuator configuration can also be changed in a plurality of stages in order to be able to signal a plurality of operating states to the engine controller. Such a configuration can be carried out, for example, by connecting the control line in the actuator configuration to ground through a plurality of resistors and corresponding switching elements, the individual resistors having different resistance values.

In accordance with another feature of the invention, there is provided a second resistor, and there are at least two switches, a second of the switches connecting the control input to ground through the second resistor. Preferably, the second resistor has a resistance smaller than the given resistance. In particular, the second resistor has a resistance substantially smaller than the given resistance.

In accordance with a further feature of the invention, there is provided a third resistor, and there are three switches, a third of the switches connecting the control input to a supply voltage through the third resistor.

In addition to the passive change in the input characteristics that is described above, it is, however, also possible to influence the input characteristics actively. The influence can be carried out, for example, by connecting the control line in the actuator configuration to the battery voltage through a switching element. The engine controller then detects the operating state of the intelligent actuator configuration from the voltage on the control line. The signaling back of the operating state from the actuator configuration to the engine controller can also be carried out by transmitting data bi-directionally on the control line if the requirement of real-time operation of the actuator configuration permits it. In a digital transmission of data, such transmission is possible, for example, within the framework of a full duplex or half-duplex mode. On the other hand, given an analog transmission of data between the actuator configuration and the engine controller, the signaling-back signal can be transmitted in a different frequency range from that of the control signal generated by the engine controller. The separation of the control signal from the signaling-back signal can be effected easily by appropriately tuned bandpass filters.

The methods of influencing the input characteristics described above have in common the fact that the control input in the intelligent actuator configuration is connected to a controllable switching element. The actuation of the input characteristics is carried out by a diagnostic circuit that is connected at the output end to the switching element at the control input in order to influence the input characteristics of the actuator configuration as a function of the operating state.

In accordance with an added feature of the invention, there are provided a plurality of switches, and the diagnostic circuit has a logic circuit with digital inputs and digital outputs and a comparator unit with analog inputs and digital outputs. The comparator unit is connected to the logic circuit for driving the logic circuit. The analog inputs are connected to the actuator and to the power switch for sensing the at least one operating state, and the digital outputs of the logic circuit are respectively connected to one of the switches for influencing the input characteristics at the control input.

In accordance with an additional feature of the invention, the digital outputs of the comparator unit are connected to the digital inputs of the logic circuit.

In the preferred embodiment of the invention, the diagnostic circuit is composed of a comparator unit and a logic circuit connected downstream. The comparator unit is connected at the input end to the output stage and/or to the actuator itself and measures current and/or voltage at these measuring points. The measured values in the comparator unit are then compared with predefined reference values to analyze the operating state of the actuator configuration. At the output end, the comparator unit then actuates the logic circuit, which activates a plurality of switching elements at the control input of the actuator configuration as a function of the operating state and, as a result, determines the input impedance at the control input.

With the objects of the invention in view, there is also provided a method for actuating an actuator configuration, in particular, an injection valve of an internal combustion engine, including the steps of providing an actuator configuration having a control input, an electrically activated actuator, and a power switch for activating the actuator, producing a control signal with an external control unit and transmitting the control signal through a control line to the control input, actuating the power switch with the control signal through the control input, sensing an operating state of the actuator configuration with a diagnostic circuit having an input connected at least to one of the group consisting of the actuator and the power switch, influencing electrical input characteristics of the actuator configuration by connecting the control input to at least one switch, and influencing the input characteristics as a function of an operating state of the actuator configuration by connecting an output of the diagnostic circuit to the at least one switch and, as a result, enabling remote diagnostics by the external control unit through the control line.

The intelligent actuator configuration and method according to the invention is suitable in a particularly advantageous way for use in an injection system of an internal combustion engine, in particular, in a common-rail injection system. However, the invention is not restricted to this field of application. Instead, the inventive principle of an intelligent actuator with a remote diagnostic facility through the control line that is present in any case can also be used in other technical fields.

Other features that are considered as characteristic for the invention are set forth in the appended claims.

Although the invention is illustrated and described herein as embodied in an actuator configuration, in particular, for actuating an injection valve of an internal combustion engine, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawing.

BRIEF DESCRIPTION OF THE DRAWING

The FIGURE is a block and schematic circuit diagram of an intelligent actuator configuration according to the invention with an engine controller.

DESCRIPTION OF THE PREFERRED EMBODIMENTS

Figure 1:
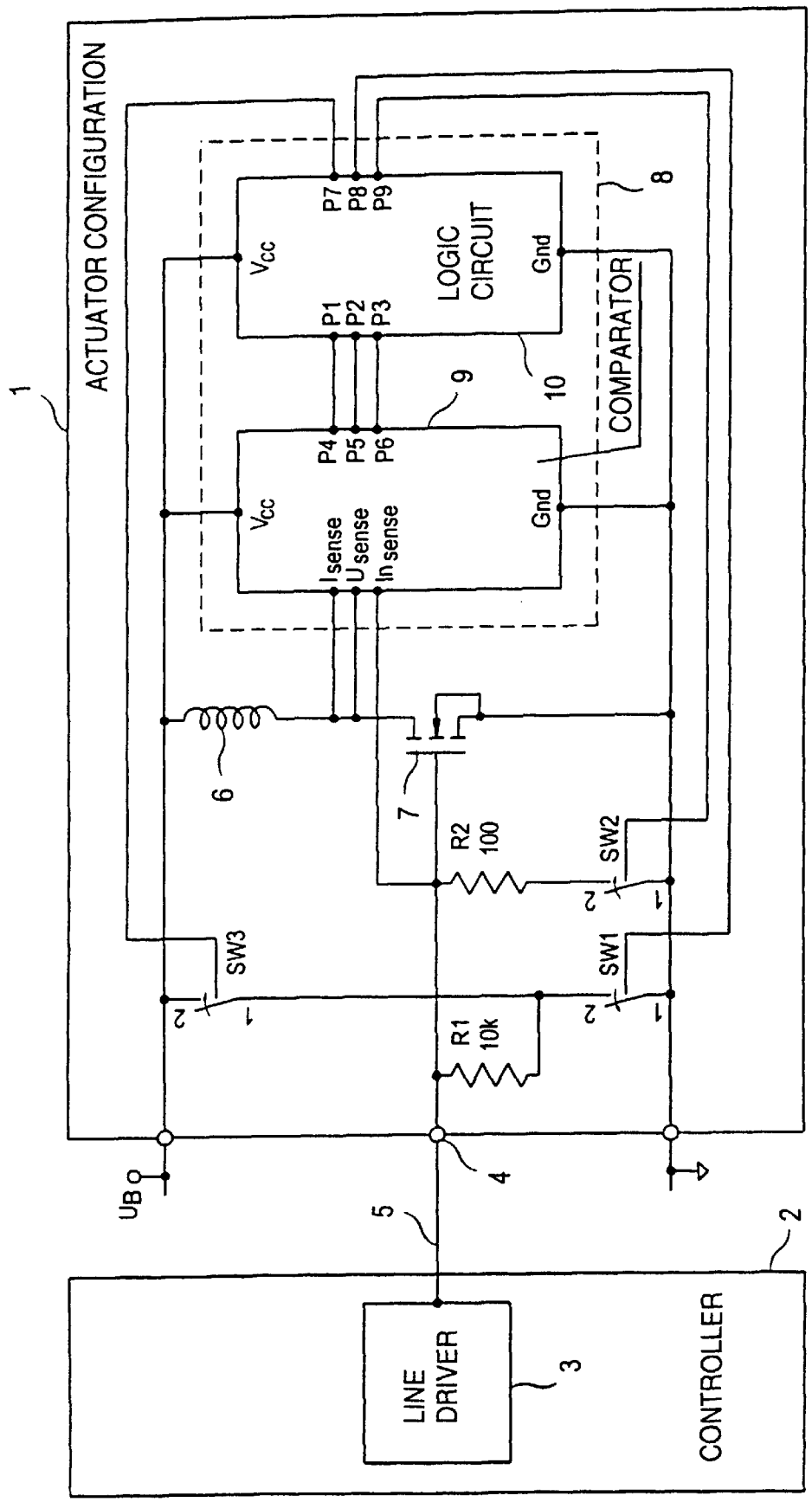

Referring now to the single FIGURE of the drawing, it is seen that the circuit diagram illustrates an actuator configuration 1 according to the invention for actuating an injection valve of an internal combustion engine.

The structural configuration of the circuit will firstly be described below and then the method of operation of the configuration according to the invention will be explained with reference to the description of the circuit diagram.

The actuator configuration 1 is actuated by an engine controller 2 (illustrated only schematically) with a line driver 3. The line driver 3 permits complete diagnostics of the line state with respect to line breaks and low-impedance short circuits to ground or operating voltage. To connect to the engine controller 2, the actuator configuration 1 has a control input 4 that is connected to the line driver 3 through a control line 5.

The mechanical activation of the injection valve is carried out here by an actuator with an exciter coil 6. One terminal of the exciter coil 6 is connected to battery voltage $U_B$ and the other terminal is connected to the drain terminal of an output stage transistor 7. The source terminal of the output stage transistor 7 is connected directly to ground so that the actuator, and, thus, also the injection valve, is activated when the output stage transistor 7 is connected through. The gate terminal of the output stage transistor 7 is connected to the control input 4 so that the line driver 3 can actuate the output stage transistor 7.

Moreover, the control input 4 is connected to ground through a series circuit composed of a first resistor R1=10 kΩ and a first switch SW1 so that the input resistor of the control input 4 can be varied by the switch SW1.

Furthermore, the control input 4 is connected to ground through a series circuit composed of a second resistor R2=100Ω and a second switch SW2 so that the input resistor can be varied in a plurality of stages as a function of the setting of the two switches SW1, SW2.

Finally, a third switch SW3 is also provided that is connected by one terminal to battery voltage $U_B$ and by the other terminal to the connecting point of the first switch SW1 and of the first resistor R1 so that the control input 4 is connected to the battery voltage $U_B$ through a series circuit composed of the first resistor R1 and of the third switch SW3 to be able to connect the control input 4 to the battery voltage $U_B$ to signal the operating state.

To actuate the three switches SW1, SW2, and SW3, a diagnostic circuit 8 is provided that is composed of a comparator unit 9 and a logic circuit 10.

The logic circuit 10 has three digital outputs P7, P8 and P9 that are connected to the control inputs of the three switches SW2, SW1, SW3. Furthermore, the logic circuit 10 has a power supply terminal $V_{CC}$ connected to battery voltage, and a ground terminal GND connected to ground. Finally, the logic circuit 10 has three digital inputs P1, P2 and P3 that determine the output signal at the three outputs P7, P8 and P9.

The comparator unit 9 has three measuring inputs $I_{SENSE}$, $U_{SENSE}$, and $In_{SENSE}$ for sensing the operating state of the actuator configuration. The measuring input $In_{SENSE}$ is connected to the control input 4 and, thus, registers the control signal of the engine controller 2. On the other hand, the measuring input $U_{SENSE}$ is connected to the drain terminal of the output stage transistor 7 and, thus, senses the voltage through the output stage transistor 7, while the measuring input $I_{SENSE}$ is connected to the connection point of the exciter coil 6 to the output stage transistor 7 and, thus, indirectly determines the current through the output stage transistor 7, and, thus, also through the exciter coil 6. Furthermore, the comparator unit 9 has a power supply terminal $V_{CC}$ connected to battery voltage, and a ground terminal GND connected to ground. Therefore, the comparator unit 9 makes an internal comparison between the measured values registered through the measuring inputs $I_{SENSE}$, $U_{SENSE}$, and $In_{SENSE}$ and predefined reference values and outputs corresponding digital signals to three digital outputs P4, P5, and P6 as a function of the comparison result. The outputs P4, P5 and P6 are connected to the inputs P1, P2 and P3 of the logic circuit 10.

The method of operation of the actuator configuration according to the invention will now be explained below with reference to the above description of the structural circuit diagram.

To clarify the circuit function, the signals at the measuring inputs $I_{SENSE}$, $U_{SENSE}$, and $In_{SENSE}$, the position of the switches SW1, SW2, SW3 and the input resistance of the control input 4 are illustrated for different operating states in the following table. The designation "C" designates here that the corresponding switch is closed, while the designation "O" corresponds to an opened switch.

| | State | $In_{sense}$ = P6 | $I_{sense}$ = P4 | $U_{sense}$ = P5 | SW1 = P8 | SW2 = P9 | SW3 = P7 | Input impedance |
|---|---|---|---|---|---|---|---|---|
| 1 | No error | LOW | LOW | HIGH | C | O | O | 10 kΩ |
|   |       | HIGH | HIGH | LOW | C | O | O | 10 kΩ |
| 2 | No Voltage | LOW | LOW | LOW | O | O | O | very large |
|   |       | HIGH | LOW | LOW | O | O | O | Very large |
| 3 | Line break at actuator | LOW | LOW | LOW | O | O | O | Very large |
|   |       | HIGH | LOW | LOW | O | O | O | Very large |
| 4 | Output stage not switching | LOW | LOW | HIGH | C | O | O | 10 kΩ |
|   |       | HIGH | LOW | HIGH | C | C | O | 100 Ω |
| 5 | Short circuit | LOW | HIGH | LOW | O | O | C | 10 kΩ to $U_B$ |

-continued

| State | In$_{sense}$ = P6 | I$_{sense}$ = P4 | U$_{sense}$ = P5 | SW1 = P8 | SW2 = P9 | SW3 = P7 | Input impedance |
|---|---|---|---|---|---|---|---|
| Output stage/ actuator | HIGH | HIGH | LOW | C | O | O | 10 kΩ |

The fault-free operation of the actuator configuration 1, represented in the first two lines of the table, will be described first. Given activation of the actuator by the engine controller 2, the line driver 3 transmits a HIGH level to the control input 4, measured by the measuring input In$_{SENSE}$, through the control line 5. Here, the output stage transistor 7 connects through so that the potential of the measuring input U$_{SENSE}$ drops to ground potential and correspondingly assumes a low level. In contrast, the measuring input I$_{SENSE}$ assumes a HIGH level because the exciter coil 6 has current flowing through it due to the connected-through output stage transistor 7. The outputs P4, P5, P6 of the comparator unit 9 and the inputs P1, P2 and P3 of the logic circuit 10 then correspondingly assume the values P4=P1=HIGH, P5=P2=LOW and P6=P3=HIGH. The logic circuit 10 then determines the levels of the outputs P7=P9=LOW and P8=HIGH as a function of the signals present at the inputs P1, P2, and P3 in accordance with the following table, i.e., the switch SW1 is closed while the switches SW2 and SW3 are closed.

Correspondingly, the input resistance R$_{IN}$ of the control input 4 is R$_{IN}$=R1=10 kΩ in such an operating state.

| P1 = P4 | P2 = P5 | P3 = P6 | P7 | P8 | P9 |
|---|---|---|---|---|---|
| LOW | LOW | LOW | LOW | LOW | LOW |
| LOW | LOW | HIGH | LOW | LOW | LOW |
| LOW | HIGH | LOW | LOW | HIGH | LOW |
| LOW | HIGH | HIGH | LOW | HIGH | HIGH |
| HIGH | LOW | LOW | HIGH | LOW | LOW |
| HIGH | LOW | HIGH | LOW | HIGH | LOW |
| HIGH | HIGH | LOW | equal | equal | equal |
| HIGH | HIGH | HIGH | equal | equal | equal |

On the other hand, in the inactivated but fault-free state a LOW level is present at the control input 4 so that the output stage transistor 7 switches off. The result of this is that the measuring input I$_{SENSE}$ exhibits a LOW level because no current flows through the exciter coil 6. On the other hand, the battery voltage, and, thus, a HIGH level, appears at the measuring input U$_{SENSE}$, while the measuring input In$_{SENSE}$ receives the control signal and, therefore, also assumes a LOW level. The inputs of the logic circuit 10 can, therefore, assume the logic values P4=P1=LOW, P5=P2=HIGH and P6=P3=LOW so that the values P7=P9=LOW and P8=HIGH are output at the outputs of the logic circuit 10 according to the table above, i.e., the switch SW1 is closed while the switches SW2 and SW3 are closed. The input resistance R$_{IN}$ of the control input 4 is correspondingly R$_{IN}$=R1=10 kΩ.

The operating characteristics of the actuator configuration 1 will now be described below for a failure of the battery voltage. In such a case, a LOW level appears at the outputs P7, P8, and P9 of the logic circuit 10 due to the drop in voltage so that all the switches SW1, SW2, and SW3 are opened. The input resistance R$_{IN}$ of the control input 4 is equal to the input resistance of the output stage transistor, i.e., has very high impedance.

If, on the other hand, there is a line break at the exciter coil 6, no current can flow through the exciter coil 6 and the measuring input I$_{SENSE}$ always assumes a LOW level. Furthermore, the measuring input U$_{SENSE}$ is always at ground potential in such a fault situation and, therefore, assumes a LOW level. The signals P1=LOW, P2=LOW are, thus, present at the inputs of the logic circuit 10, while the input P3 depends on the control input 4. The logic circuit 10 calculates from the above the output signals P7=P8=P9=LOW from the above table so that all the switches SW1, SW2, and SW3 are opened. The input resistance at the control input 4 has very high impedance in this case as in the case of the loss of the battery voltage described above.

The operating characteristics of the actuator configuration 1 will now be described below for the fault situation in which the output stage transistor 7 no longer connects through. In such a case, the measuring input U$_{SENSE}$ is always connected to battery voltage, and, thus, is at a HIGH potential, while the measuring input I$_{SENSE}$ assumes a LOW potential because current can no longer flow through the exciter coil 6. Therefore, in such a fault situation, the signals P1=P4=LOW and P2=P5=HIGH appear at the inputs of the logic circuit 10, while the input signal P3 depends on the actuation by the engine controller 2. In accordance with the above logic table, P8=HIGH and P7=LOW then appears at the output so that the switch SW1 closes while the switch SW3 opens. On the other hand, in this case, the position of the switch SW2 is dependent on the actuation by the engine controller. When there is a control signal In$_{SENSE}$=LOW, a LOW level also appears at the input P3 of the logic circuit 10 so that a LOW level appears at the output P9 of the logic circuit 10 and the switch SW2 is opened. The input resistance R$_{IN}$ of the actuator configuration 1 is equal to the resistance R1=10 kΩ in such a fault situation. On the other hand, when the actuator configuration 1 is actuated by the engine controller 2, the measuring input In$_{SENSE}$ assumes a HIGH level so that a HIGH level is also present at the input P3 of the logic circuit 10. The output P9 of the logic circuit 10 then assumes a HIGH level in accordance with the above logic table so that the switch SW2 also closes. The internal resistance R$_{IN}$ at the control input 4 is then substantially equal to the resistance R2=100Ω.

Finally, the fault situation in which the output stage transistor 7 has a short circuit or the exciter coil 6 has a short circuit to ground will be described. In such a case, the measuring input U$_{SENSE}$ is at ground potential so that a LOW level is present at the output P5 of the comparator unit 9 and at the input P2 of the logic circuit 10. Due to the short circuit at the output stage transistor 7, the measuring input I$_{SENSE}$ is at HIGH potential so that a HIGH potential appears at the output P4 of the comparator unit 9 and at the input P1 of the logic circuit 10 while the signal at the input P3 of the logic circuit 10 depends on the actuation by the engine controller 2. When there is a HIGH level on the control line 5, a HIGH level also appears at the input P3 of the logic circuit 10 so that the outputs of the logic circuit 10 assume the values P9=LOW, P8=HIGH and P7=LOW. Correspondingly, the switch SW1 is closed while the switches SW2 and SW3 are opened. The input resistance $R_{IN}$ at the control input 4 is then $R_{IN}$=10 kΩ. On the other hand, when there is a LOW level on the control line 5, a LOW level appears at the measuring input $In_{SENSE}$, and, thus, also at the input P3 of the logic circuit 10. The outputs of the logic circuit 10 then assume the values P9=LOW, P7=HIGH and P8=LOW so that the switch SW3 is closed while the switches SW1 and SW2 are opened. The battery voltage $U_B$ is then present at the control input 4 through the input resistance $R_{IN}$=R1=10 kΩ. The input resistance $R_{IN}$ at the control input 4 and/or the voltage at the control input 4 thus depend on the operating state of the actuator configuration 1 so that the engine controller 2 can determine the operating state of the actuator configuration 1 by monitoring the control line 5 without additional lines.

The invention is not restricted in its embodiment to the preferred exemplary embodiments given above. Instead, a number of variants are conceivable that make use of the solution presented, even with embodiments that are fundamentally different.

We claim:

1. An actuator configuration, comprising:
    an electrically activated actuator;
    a power switch connected to said actuator for activating said actuator;
    at least one switch;
    a control input for receiving a control signal from an external control unit through a control line, the control signal actuating said power switch, said control input connected to:
        said power switch; and
        said at least one switch for influencing electrical input characteristics of the actuator configuration; and
    a diagnostic circuit for sensing at least one operating state of the actuator configuration, said diagnostic circuit having:
        a circuit input connected to at least to one of the group consisting of said actuator and said power switch; and
        a circuit output connected to said at least one switch for influencing the input characteristics as a function of the at least one operating state and, as a result, permitting remote diagnostics by the external control unit through the control line.

2. The actuator configuration according to claim 1, including a resistor, said at least one switch connecting said control input to ground through said resistor.

3. The actuator configuration according to claim 2, including a second resistor, and wherein:
    said at least one switch is at least two switches; and
    a second of said switches connects said control input to ground through said second resistor.

4. The actuator configuration according to claim 3, wherein:
    said resistor has a given resistance; and
    said second resistor has a resistance smaller than said given resistance.

5. The actuator configuration according to claim 3, wherein:
    said resistor has a given resistance; and
    said second resistor has a resistance substantially smaller than said given resistance.

6. The actuator configuration according to claim 3, including a third resistor, and wherein:
    said at least two switches is three switches; and
    a third of said switches connects said control input to a supply voltage through said third resistor.

7. The actuator configuration according to claim 1, wherein:
    said at least one switch is a plurality of switches;
    said diagnostic circuit has:
        a logic circuit with digital inputs and digital outputs; and
        a comparator unit with analog inputs and digital outputs, said comparator unit connected to said logic circuit for driving said logic circuit;
    said analog inputs are connected to said actuator and to said power switch for sensing the at least one operating state; and
    said digital outputs of said logic circuit are respectively connected to one of said switches for influencing the input characteristics at said control input.

8. The actuator configuration according to claim 7, wherein said digital outputs of said comparator unit are connected to said digital inputs of said logic circuit.

9. An actuator configuration for actuating an injection valve of an internal combustion engine, the actuator configuration comprising:
    an electrically activated actuator;
    a power switch connected to said actuator for activating said actuator;
    at least one switch;
    a control input for receiving a control signal from an external control unit through a control line, the control signal actuating said power switch, said control input connected to:
        said power switch; and
        said at least one switch for influencing electrical input characteristics of the actuator configuration; and
    a diagnostic circuit for sensing at least one operating state of the actuator configuration, said diagnostic circuit having:
        a circuit input connected to at least to one of the group consisting of said actuator and said power switch; and
        a circuit output connected to said at least one switch for influencing the input characteristics as a function of the at least one operating state and, as a result, permitting remote diagnostics by the external control unit through the control line.

10. In an actuator assembly having an external control unit sending a control signal through a control line, an actuator configuration comprising:
    an electrically activated actuator;
    a power switch connected to said actuator for activating said actuator;
    at least one switch;
    a control input connected to the control line for actuating said power switch with the control signal, said control input connected to:

said power switch; and said at least one switch for influencing electrical input characteristics of the actuator configuration; and a diagnostic circuit for sensing at least one operating state of the actuator configuration, said diagnostic circuit having:

a circuit input connected to at least to one of the group consisting of said actuator and said power switch; and a circuit output connected to said at least one switch for influencing the input characteristics as a function of the at least one operating state and, as a result, permitting remote diagnostics by the external control unit through the control line.

11. In an actuator assembly having an external control unit sending a control signal through a control line, an actuator configuration for actuating an injection valve of an internal combustion engine, the actuator configuration comprising:

an electrically activated actuator;

a power switch connected to said actuator for activating said actuator;

at least one switch;

a control input connected to the control line for actuating said power switch with the control signal, said control input connected to:

said power switch; and said at least one switch for influencing electrical input characteristics of the actuator configuration; and a diagnostic circuit for sensing at least one operating state of the actuator configuration, said diagnostic circuit having:

a circuit input connected to at least to one of the group consisting of said actuator and said power switch; and a circuit output connected to said at least one switch for influencing the input characteristics as a function of the at least one operating state and, as a result, permitting remote diagnostics by the external control unit through the control line.

12. A method for actuating an injection valve of an internal combustion engine, which comprises:

providing an actuator configuration having a control input, an electrically activated actuator, and a power switch for activating the actuator;

producing a control signal with an external control unit and transmitting the control signal through a control line to the control input;

actuating the power switch with the control signal through the control input;

sensing an operating state of the actuator configuration with a diagnostic circuit having an input connected at least to one of the group consisting of the actuator and the power switch;

influencing electrical input characteristics of the actuator configuration by connecting the control input to at least one switch; and influencing the input characteristics as a function of an operating state of the actuator configuration by connecting an output of the diagnostic circuit to the at least one switch and, as a result, enabling remote diagnostics by the external control unit through the control line.

* * * * *